(12) United States Patent
Hashimoto

(10) Patent No.: US 7,746,232 B2
(45) Date of Patent: Jun. 29, 2010

(54) ELECTRONIC SUBSTRATE, SEMICONDUCTOR DEVICE, AND ELECTRONIC DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 314 days.

(21) Appl. No.: 11/712,361

(22) Filed: Feb. 28, 2007

(65) Prior Publication Data
US 2007/0205956 A1 Sep. 6, 2007

(30) Foreign Application Priority Data
Mar. 3, 2006 (JP) .............................. 2006-057672

(51) Int. Cl.
*G08B 13/14* (2006.01)
(52) U.S. Cl. .................. 340/572.7; 340/572.1; 336/200
(58) Field of Classification Search ............. 340/572.1, 340/572.5, 272.7, 272.8, 10.1, 572.7, 572.8; 235/491, 492, 462.43, 462.46; 343/895, 343/866; 257/698, 687, 531, 724; 361/762; 336/200, 232
See application file for complete search history.

(56) References Cited

U.S. PATENT DOCUMENTS

| | | | |
|---|---|---|---|
| 6,933,601 B2 * | 8/2005 | Satoh et al. .................. | 257/698 |
| 6,998,710 B2 | 2/2006 | Kobayashi et al. | |
| 7,056,801 B2 | 6/2006 | Park et al. | |
| 7,064,645 B2 | 6/2006 | Kobayashi et al. | |
| 7,201,328 B2 * | 4/2007 | Usami et al. ................. | 235/492 |
| 7,250,867 B2 * | 7/2007 | Sakama et al. ........... | 340/572.7 |
| 2002/0063340 A1 | 5/2002 | Sahara et al. | |
| 2003/0218247 A1 | 11/2003 | Shimoishizaka et al. | |
| 2007/0176845 A1 * | 8/2007 | Yamazaki et al. ........... | 343/895 |
| 2007/0289772 A1 | 12/2007 | Kuroda et al. | |
| 2008/0174976 A1 * | 7/2008 | Satoh et al. .................. | 361/762 |

FOREIGN PATENT DOCUMENTS

| | | |
|---|---|---|
| JP | 57-211707 | 12/1982 |
| JP | 2002-164468 | 6/2002 |
| JP | 2003-347410 | 12/2003 |
| JP | 2005-183870 | 7/2005 |
| JP | 2005-228981 | 8/2005 |
| KR | 2003-0051298 | 6/2003 |
| KR | 2005-067820 | 7/2005 |

* cited by examiner

*Primary Examiner*—Van T. Trieu
(74) *Attorney, Agent, or Firm*—Harness, Dickey & Pierce, P.L.C.

(57) ABSTRACT

An electronic substrate including: a base substrate having an active face and a rear face; and a plurality of inductor elements formed on or above the active face, or formed on or above the rear face.

8 Claims, 9 Drawing Sheets

ELECTRONIC SUBSTRATE, SEMICONDUCTOR DEVICE, AND ELECTRONIC DEVICE

CROSS-REFERENCE TO RELATED APPLICATION

This application claims priority from Japanese Patent Application No. 2006-057672, filed Mar. 3, 2006, the contents of which are incorporated herein by reference.

BACKGROUND

1. Technical Field

The present invention relates to electronic substrate, semiconductor device, and electronic device.

2. Related Art

Electronic substrates (semiconductor chips) with integrated circuits are provided in electronic devices such as mobile telephones, notebook personal computers, and personal data assistants (PDA).

Generally, a connection terminal is formed in the electronic substrate, which is packaged on other electronic substrate or motherboard through this connection terminal.

This allows signals such as power transmission signals and communication signals to be exchanged between the electronic substrate and other electronic substrate or motherboard.

This kind of technology has been disclosed, for instance, in Japanese Unexamined Patent Application, First Publication No. 2002-164468 and in Japanese Unexamined Patent Application, First Publication No. 2003-347410.

However, when a connection terminal is formed on an electronic substrate, there are problems in that the structure becomes complex, and the packaging operation related to the connection terminal and other electronic substrate, the packaging operation related to the connection terminal and motherboard, and so on, becomes complex.

Furthermore, there is concern that a defective conduction or short-circuitting occur, which may degrade the reliability of electrical connectivity.

SUMMARY

An advantage of some aspects of the invention is to provide an electronic substrate and a semiconductor device, in which it is possible to realize a simple structure and to simplify packaging operation, an electronic device in which is possible to be low-cost.

A first aspect of the invention provides an electronic substrate including: a base substrate having an active face and a rear face; and a plurality of inductor elements formed on or above the active face, or formed on or above the rear face.

According to this configuration, since transmission and communications can be performed using the inductor elements formed on the electronic substrate, the connection terminal on the electronic substrate can be eliminated, and hence, the construction of the electronic substrate can be simplified.

As a result, the packaging operation of the electronic substrate can be simplified. Moreover, the degradation in reliability accompanying the packaging operation can be prevented.

It is preferable that, in the electronic substrate of the first aspect of the invention, the inductor elements include: a first inductor element; and a second inductor element having an inductance value or an applicable frequency that are different from that of the first inductor element.

Here, the "applicable frequency" is an indication of the characteristic of the inductor as an antenna when the inductor is made to work as an antenna, and is a frequency that can used for an antenna.

According to this configuration, the functions of each inductor element can be shared. Thereby it is possible to optimally design each inductor element.

As a result, the miniaturization and transmission efficiency of each inductor element can be enhanced.

It is preferable that, in the electronic substrate of the first aspect of the invention, the first inductor element be used for external power transmission, and the second inductor element be used for external communications.

According to this configuration, the inductor element can send/receive all external signals. Thus, the connection terminal of the electronic substrate can be eliminated.

It is preferable that the electronic substrate of the first aspect of the invention further include: a connection terminal formed on the base substrate, used for external power transmission. In this configuration, the first inductor element and the second inductor element are used for external communications.

According to this configuration, power transmission only can be performed accurately by this connection terminal.

Moreover, by performing external communications using the inductor elements, the communication speed can be enhanced.

It is preferable that the electronic substrate of the first aspect of the invention further include: a dielectric layer formed between at least some of the inductor elements and the base substrate, made of material having a dielectric dissipation factor smaller than that of the base substrate.

According to this configuration, the absorption of the electromagnetic wave output by the inductor element as eddy current loss in the base substrate can be prevented. As a result, the performance of the element as an antenna can be enhanced.

A second aspect of the invention provides a semiconductor device including: a plurality of electronic substrates, each of which includes: a base substrate having an active face and a rear face; and a plurality of inductor elements formed on or above the active face, or on or above the rear face. In this configuration, the electronic substrates are disposed so as to be laminated, the inductor element functions as an antenna sending or receiving electromagnetic waves so as to send or receive signals between the electronic substrates.

The semiconductor device of the second aspect of the invention includes the electronic substrate mentioned above. Therefore, the connection terminal can be eliminated.

Accordingly, the packaging operation of electronic substrate can be simplified, and the production cost can be reduced.

Moreover, the degradation in reliability accompanying packaging operation can be prevented.

It is preferable that, in the semiconductor device of the second aspect of the invention, the inductor elements formed on a pair of the electronic substrates sending or receiving signals are disposed to face each other.

With such a configuration, the transmission efficiency can be further enhanced. Moreover, interference can be prevented.

A third aspect of the invention provides an electronic device including the electronic substrate mentioned above.

According to this configuration, the connection terminal is eliminated in the electronic substrate. Therefore, electronic device with low cost can be offered.

BRIEF DESCRIPTION OF THE DRAWINGS

FIG. 2A shows a plan view while

DESCRIPTION OF EXEMPLARY EMBODIMENTS

Figure 1:
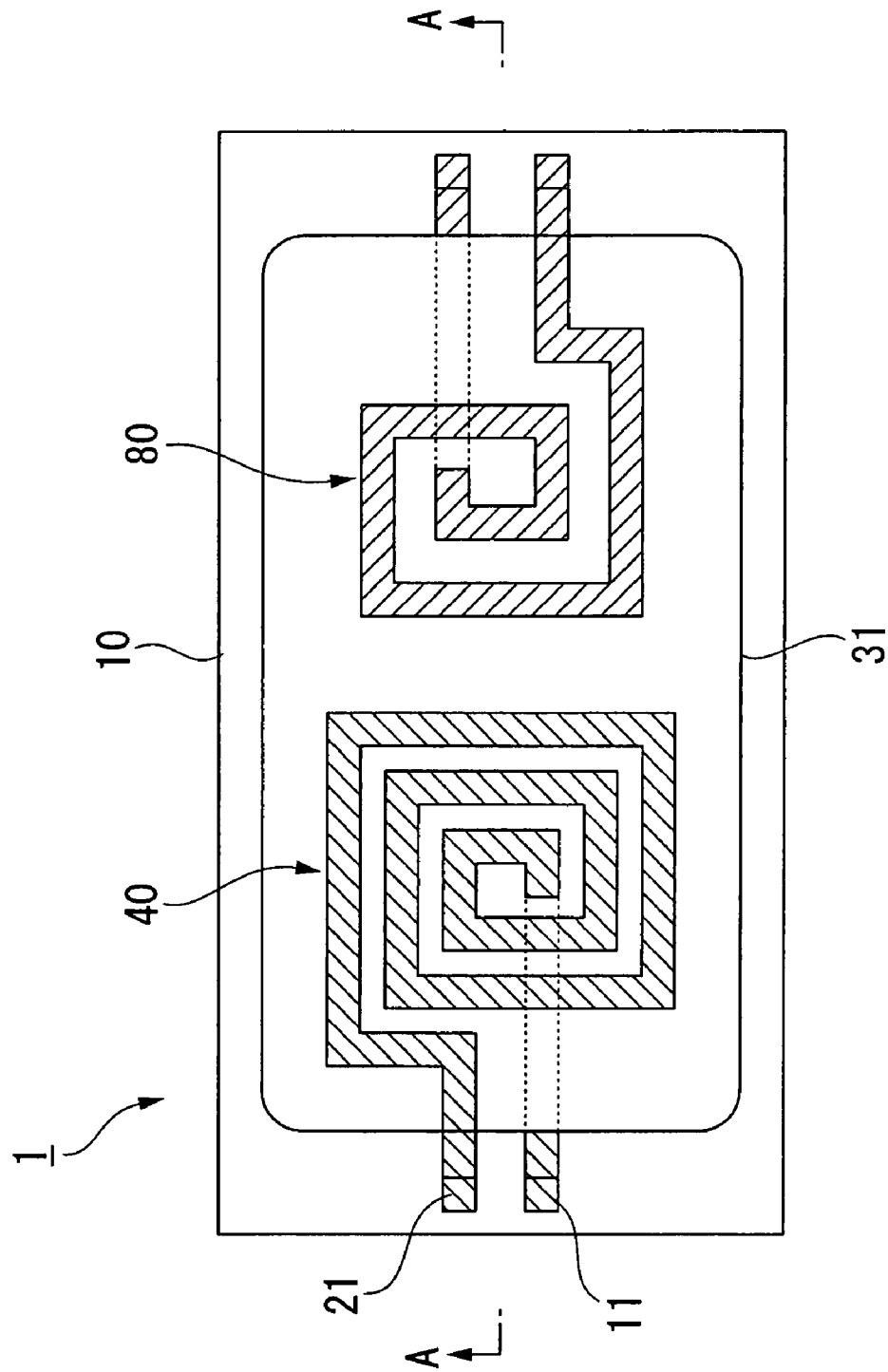
FIG. 1 shows a plan view of the electronic substrate related to the first embodiment.

The embodiments of this invention are described here referring to the drawings.

The scale of each member shown in each drawing used in the explanations below has been changed appropriately to a suitable size to enable each member to be easily recognized.

First Embodiment

The electronic substrate related to the first embodiment is described here at first.

FIG. 1 shows a plan view of the electronic substrate related to the first embodiment.

An electronic substrate 1 related to the first embodiment includes base substrate 10 with an active face. A plurality of inductor elements 40 and 80 is formed with different inductance value or different applicable frequency on or above the active of the base substrate 10.

Among these elements, the first inductor element 80 is used for communications. The second inductor element 40 is used for power transmission.

The electronic substrate includes the base substrate 10 made of silicon, glass, quartz, crystal, and so on.

Electronic circuit (not shown in the views) is formed on the active face of the base substrate 10.

This electronic circuit includes at least a wiring pattern formed thereon, semiconductor elements such as a plurality of thin film transistors (TFT), or a plurality of passive components (parts), and wiring that connects these parts.

A dielectric layer 31 described later, is formed at the center of the active face of the base substrate 10.

This dielectric layer 31 may be formed on the entire surface of the active face.

If the electronic substrate 1 is an insulator, the dielectric layer 31 is not always necessary. For instance, the dielectric layer 31 may be formed to proactively obtain optimum inductor characteristics by improving the Q value or by adjusting the self-resonant frequency.

Electrodes 11 and 21 are formed in an array at the peripheral portion of the active face of the base substrate 10 for electrical connectivity of the electronic circuit to external parts.

The inductor elements 40 and 80 are formed that extend over the surface of the dielectric layer 31 from the electrodes 11 and 21.

Figure 2A:
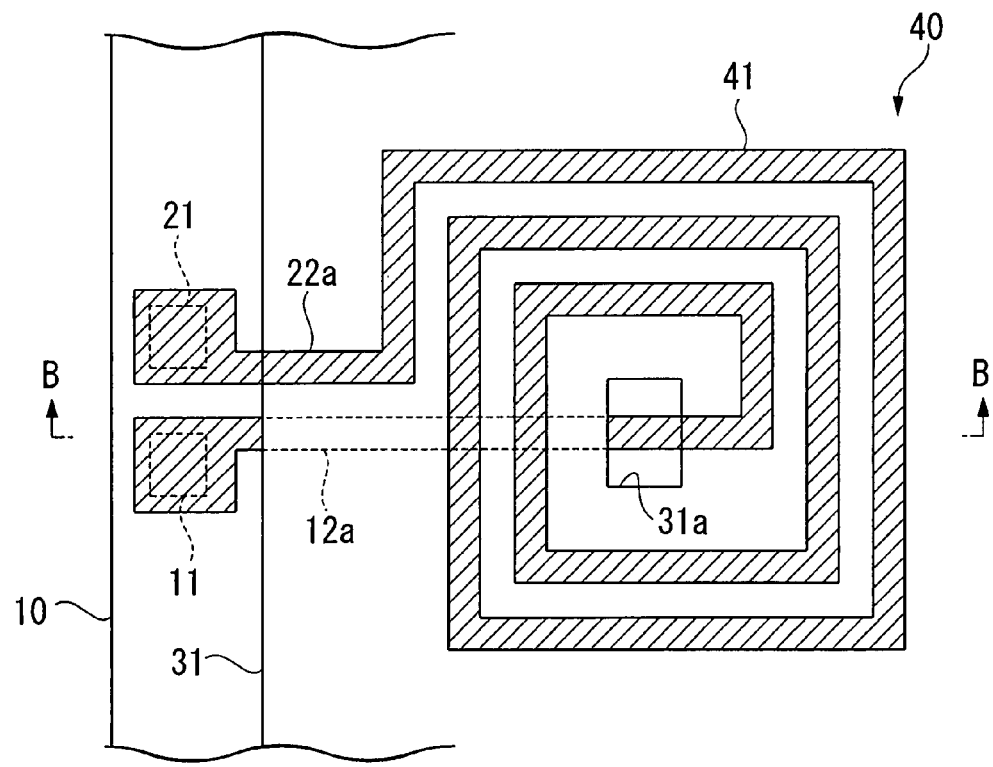
Figure 2B:
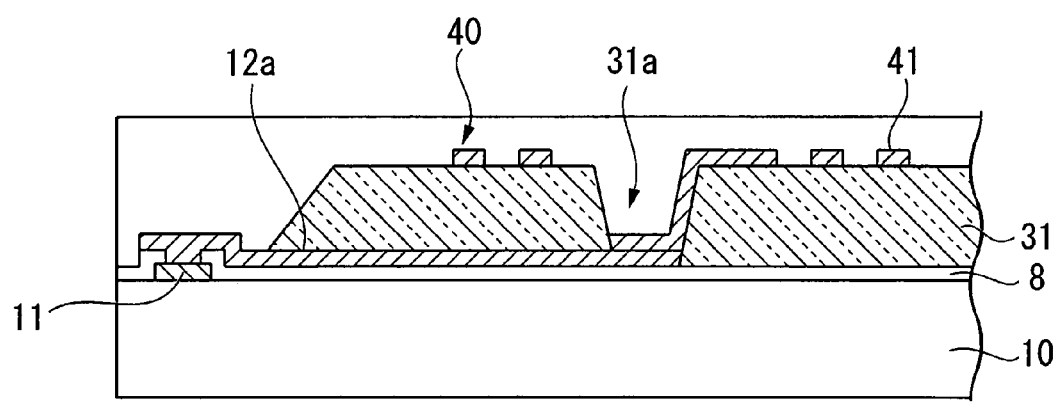
FIG. 2B shows a cross-sectional view of the inductor element.

FIGS. 2A and 2B are explanatory drawings of the inductor element. FIG. 2A shows a plan view, while FIG. 2B shows a cross-sectional view taken along the line B-B in FIG. 2A.

As shown in FIG. 2B, a passivation film 8 made of an electrically-insulated material such as SiN, is formed on the active face of the base substrate 10 to protect the electronic circuit.

The electrode 11 is formed at the peripheral portion of the active face of the base substrate 10 for electrical connectivity of the electronic circuit to external parts.

An opening of the passivation film 8 is formed on the surface of this electrode 11.

A connecting wire 12a is formed that extends over the surface of the passivation film 8 from this opening.

This connecting wire 12a may be a single layer or multi-layer wire made of a single conductive material or compound conductive material that may include copper (Cu), gold (Au), silver (Ag), titanium (Ti), tungsten (W), titanium tungsten (TiW), titanium nitrogen (TiN), nickel (Ni), nickel vanadium (NiV), chrome (Cr), aluminum (Al), or palladium (Pd).

In the case in which the connecting wire 12a is made by the electro-plating method, the connecting wire 12a is generally formed on the surface of the under layer, but the under layer is not shown in FIG. 2B.

The dielectric layer 31 is formed to cover this connecting wire 12a.

A through hole 31a is formed in this dielectric layer 31 to expose the end of the connecting wire 12a.

A winding wire 41 of the inductor element 40 is formed on the surface of this dielectric layer 31.

The material forming the winding wire 41 is the same as the one forming the connecting wire 12a. However, a material with required resistance range or with characteristics such as permissible current value may be appropriately selected for the material of the winding wire 41.

As shown in FIG. 2A, the winding wire 41 is formed in a substantially rectangular spiral shape, but it may also be formed in a substantially circular shape or a substantially polygonal shape.

As shown in FIG. 2B, the winding wire 41 is formed in the same plane when seen from the side view.

That is, flat inductor element (spiral inductor element) is used as the inductor element 40 in this embodiment.

As shown in FIG. 2A, the outer end of the winding wire 41 is connected to the electrode 21 via the connecting wire 22a.

The inner end of the winding wire 41 is connected to the other end of the connecting wire 12a after passing through the through hole 31a.

The other end of this connecting wire 12a is connected to the electrode 11 after it is drawn outside the winding wire 41.

Short-circuitting between the connecting wire 12a and the winding wire 41 is prevented by the dielectric layer 31 when the connecting wire 12a is drawn outside.

The inductor element 40 works as an antenna and outputs electromagnetic waves of the applicable frequency when current flows from the electrodes 11 and 21 to the inductor element 40.

The silicon that forms the base substrate 10 is a wave-absorbing body, and the electromagnetic waves output by the inductor element 40 are absorbed and attenuated, as shown in FIG. 2B.

However, the above-mentioned dielectric layer 31 allows the inductor element 40 and the base substrate 10 to be separately arranged in this embodiment.

The thickness of the dielectric layer 31 may be greater than 20 μm, for instance.

In this arrangement, it is possible to inhibit the absorption by the base substrate 10 of the electromagnetic waves output by the inductor element 40.

In other words, eddy current loss in the base substrate 10 can be reduced.

It is preferable that a material with small dielectric dissipation factor be used as the material forming the dielectric layer 31.

The dielectric dissipation factor indicates the electric energy loss level within an insulating body when alternating current is impressed on it.

By using a material with small dielectric dissipation factor as the material of the dielectric layer 31, the absorption of electromagnetic waves output by the inductor element 40 as eddy current loss in the base substrate can be inhibited, and the performance of the inductor element as an antenna can be enhanced.

More specifically, it is preferable that a material such as polyimide or benzocyclobutene (BCB) or fluoride resin be used as the material of the dielectric layer 31.

Figure 3A:
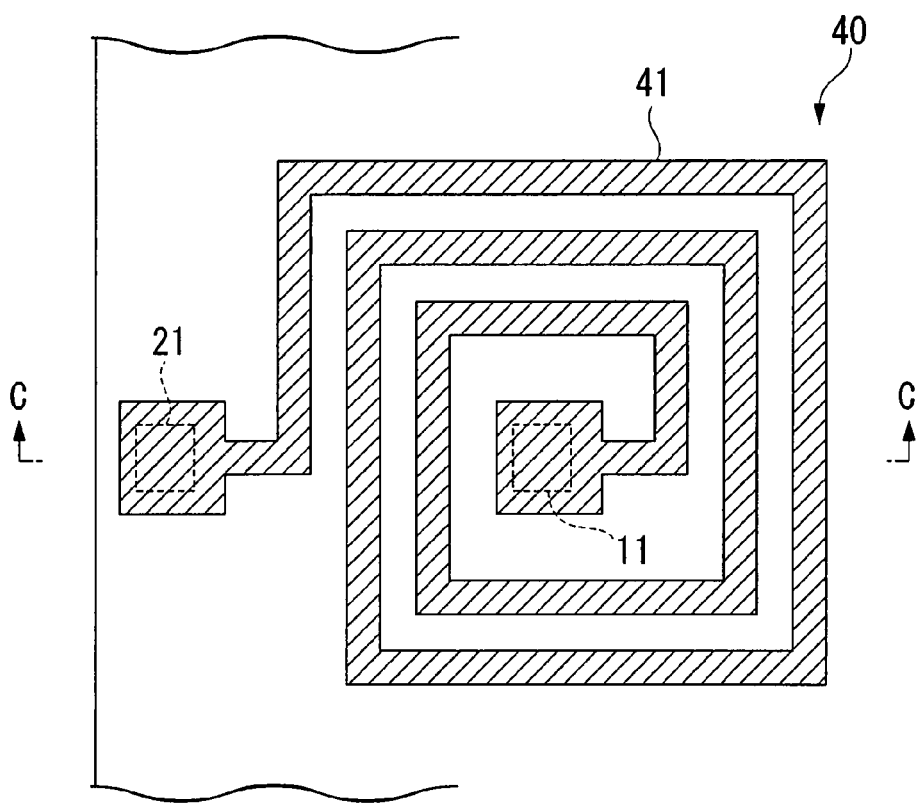
FIGS. 3A and 3B are explanatory views of the examples of modification of the inductor element.
Figure 3B:
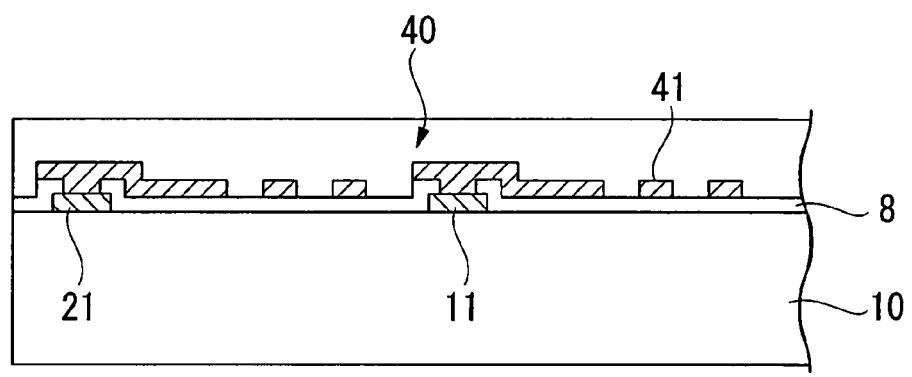

FIGS. 3A and 3B are explanatory drawings of the examples of modification of the inductor element. FIG. 3A shows a plan view, while FIG. 3B shows the cross-sectional view taken along the line C-C in FIG. 3A.

As shown in FIG. 3B, the above-mentioned dielectric layer is not formed in this example of modification. Thus, the winding wire 41 of the inductor element 40 is directly formed on the surface of the passivation film 8.

Moreover, since dielectric layer is not formed, grade separation of the winding wire 41 and the connecting wire cannot be made as mentioned above.

For this reason, the inner end of the winding wire 41 connected to the electrode 11 is formed at the center of the winding wire 41, as shown in FIG. 3A.

Also, the inductor element 40 may be formed on the surface of the passivation film 8 shown in FIG. 3B, a dielectric layer formed to cover this inductor element, and other inductor elements may be formed on the surface of this dielectric layer.

By overlapping the inductor elements in this way, the electronic substrate can be miniaturized.

By adjusting each inductor element with a different inductance value or applicable frequency, interference can be prevented, when each inductor element is used as an antenna.

Although the inductor element 40 is formed on the outside of the passivation film 8 in the example of modification shown in FIG. 3B, the inductor element 40 may be formed on the inside of the passivation film 8.

In this case, the winding wire 41 may be made of a conductive material such as Cu or Al using a semiconductor element production process.

Also, inductor elements may be overlapped on the inside and outside of the passivation film 8.

Returning to FIG. 1, the first inductor element 80 and the second inductor element 40 are formed in the base substrate 10.

The number of turns in the winding wire of the second inductor element 40 is more than that of the winding wire in the first inductor element 80.

Generally, in the case in which the number of turns of the wire in the inductor element increases, the path of the inductor element becomes longer, and the inductance (L value) increases.

If the inductance increases, the applicable frequency shifts toward the low frequency side in the characteristic of the inductor.

Accordingly, the applicable frequency of the second inductor element 40 shifts more toward the low frequency side than that of the first inductor element 80 in the characteristic of the inductor.

The "applicable frequency" is an indication of the characteristic of the inductor as an antenna when the inductor is made to work as an antenna, and is a frequency that can be used for an antenna.

Each inductor in the first embodiment functions as an antenna. Of these, the first inductor element 80 is meant for use in communications, and the applicable frequency may be adjusted in the range of 2 to 5 GHz for high speed, large volume communications.

The second inductor element 40 is used for power transmission, and the applicable frequency is adjusted in the range of several kHz to several hundred MHz.

By superimposing electromagnetic waves of high frequency for communications on low frequency electromagnetic waves for power transmission and outputting them, the second inductor element can be shared for power transmission and for communications.

In each embodiment in this Specification, descriptions are given with examples of winding wire (spiral) type inductors, but this invention is not limited to these examples. Any object that functions as inductor or antenna can be used in each of these embodiments.

In addition to winding wire (spiral) type inductors, meandering-type, trochoidal-type, patching-type wires are also well known. When these are used, the magnitude of the inductance value will depend on the inductor and the antenna.

Semiconductor Device

Figure 4:
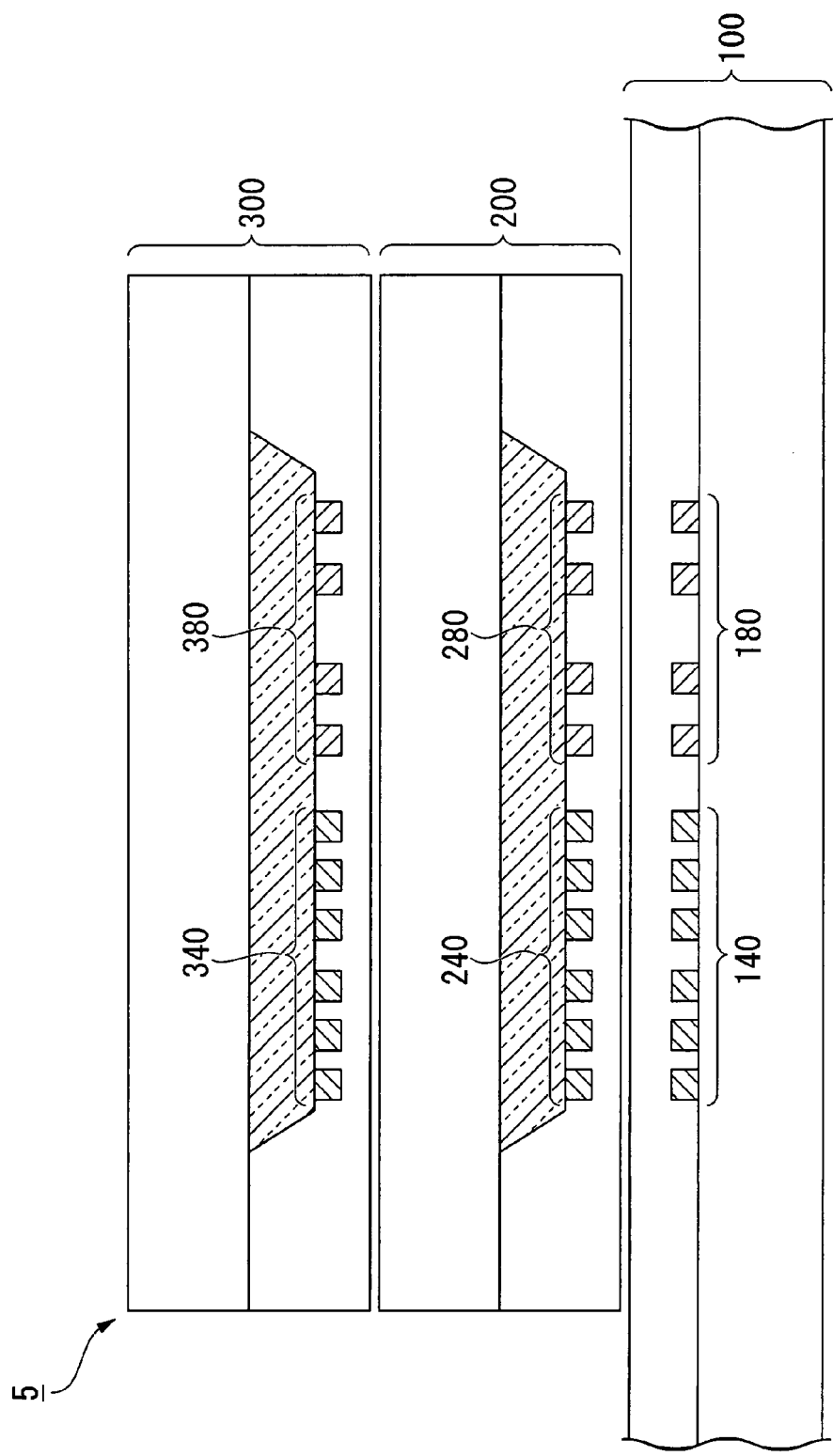
FIG. 4 is an explanatory view of the semiconductor device related to the first embodiment.

FIG. 4 is an explanatory drawing of a semiconductor device related to the first embodiment, and is a cross-sectional view taken along the line A-A in FIG. 1.

As shown in FIG. 4, a semiconductor device 5 related to the first embodiment includes a motherboard 100. A first electronic substrate 200 and a second electronic substrate 300 are sequentially packaged on the surface of the motherboard 100.

The motherboard 100 is made of glass epoxy resin. A first inductor element 180 and a second inductor element 140 are formed on the upper surface of this motherboard.

This first inductor element 180 is meant for use in communications, and its applicable frequency is adjusted in the range of 2 to 5 GHz.

The second inductor element 140 is meant for use in power transmission, and the applicable frequency is adjusted in the range of several kHz to several hundred MHz.

The first electronic substrate 200 is packaged on the upper surface of the motherboard 100 using an adhesive (not shown in the drawings).

A first inductor element 280 of the first electronic substrate 200 and the first inductor element 180 of the motherboard 100 are adjusted at the equivalent applicable frequency, and are arranged to face each other.

That is, the first inductor elements 180 and 280 are arranged such that the normals of each element passing through their centerlines generally coincide.

Also, a second inductor element 240 of the first electronic substrate 200 and the second inductor element 140 of the motherboard 100 are adjusted at the equivalent applicable frequency, and are arranged to face each other.

The second electronic substrate 300 is packaged on the rear face of the first electronic substrate 200 using an adhesive (not shown in the drawings).

A first inductor element 380 of the second electronic substrate 300 and the first inductor element 180 of the motherboard 100 are adjusted at the same equivalent applicable frequency, and are arranged to face each other on both sides of the first electronic substrate 200.

Also, a second inductor element 340 of the second electronic substrate 300 and the second inductor element 140 of the motherboard 100 are adjusted at the equivalent applicable frequency, and are arranged to face each other on both sides of the first electronic substrate 200.

By passing current through the second inductor element 140 of the motherboard 100 in the semiconductor device 5 with the configuration mentioned above, electromagnetic wave is transmitted from the second inductor element 140.

This electromagnetic wave is received by the second inductor element 240 of the first electronic substrate 200, and the second inductor element 340 of the second electronic substrate 300, and electric energy is extracted.

In this way, by sending/receiving electromagnetic wave taking the second inductor elements 140, 240, and 340 as antenna, power is transmitted from the motherboard 100 to the first electronic substrate 200 and the second electronic substrate 300.

As the result, the first electronic substrate 200 and the second electronic substrate 300 can be driven.

In this case, the second inductor elements 140, 240, and 340 that send/receive electromagnetic waves are arranged to face each other. Thus, the power transmission loss can be inhibited and the transmission efficiency can be improved.

Also, the electromagnetic wave sent from one among the first inductor element 180 of the motherboard 100, or each of the first inductor elements 280 and 380, of each electronic substrates 200 and 300, is received by another element and the electrical signal is extracted.

In this way, by sending/receiving electromagnetic waves taking the first inductor elements 180, 280, and 380 as antenna, communications can be performed between the electronic substrates 200 and 300, and the motherboard.

As the result, the electronic substrate can be made to function as a driver.

By sending the electromagnetic wave from either the first inductor element 280 of the first electronic substrate 200, or the first inductor element 380 of the second electronic substrate 300, and receiving it by the other, communications between the first electronic substrate 200 and the second electronic substrate 300 can be performed.

Also, by appropriately adjusting the applicable frequency and output of each inductor element formed on the motherboard 100 and/or each electronic substrate 200 and 300, communications between the semiconductor device 5 and external parts can be performed.

As described above, the inductor elements with different inductance values or applicable frequencies are formed on the active face of the base substrate in the electronic substrate related to this embodiment. Of these elements, the first inductor element is used for communications while the second inductor element is used for power transmission.

According to this configuration, power transmission and communications can be performed using the inductor elements formed on the electronic substrate. Thus, there is no need to provide a connection terminal on the electronic substrate, and hence, the construction of the electronic substrate can be simplified.

As a result, the packaging operation of electronic substrate can be simplified.

More specifically, accurate alignment of the two components and reflow work are not necessary.

Moreover, the degradation in reliability accompanying packaging operation can be prevented.

More specifically, defective conduction and short circuits accompanying packaging operation can be prevented.

In this way, the occurrence of production defects can be inhibited, therefore, the production yield can be improved.

Second Embodiment

Next, the electronic substrate related to the second embodiment is described here.

Figure 5A:
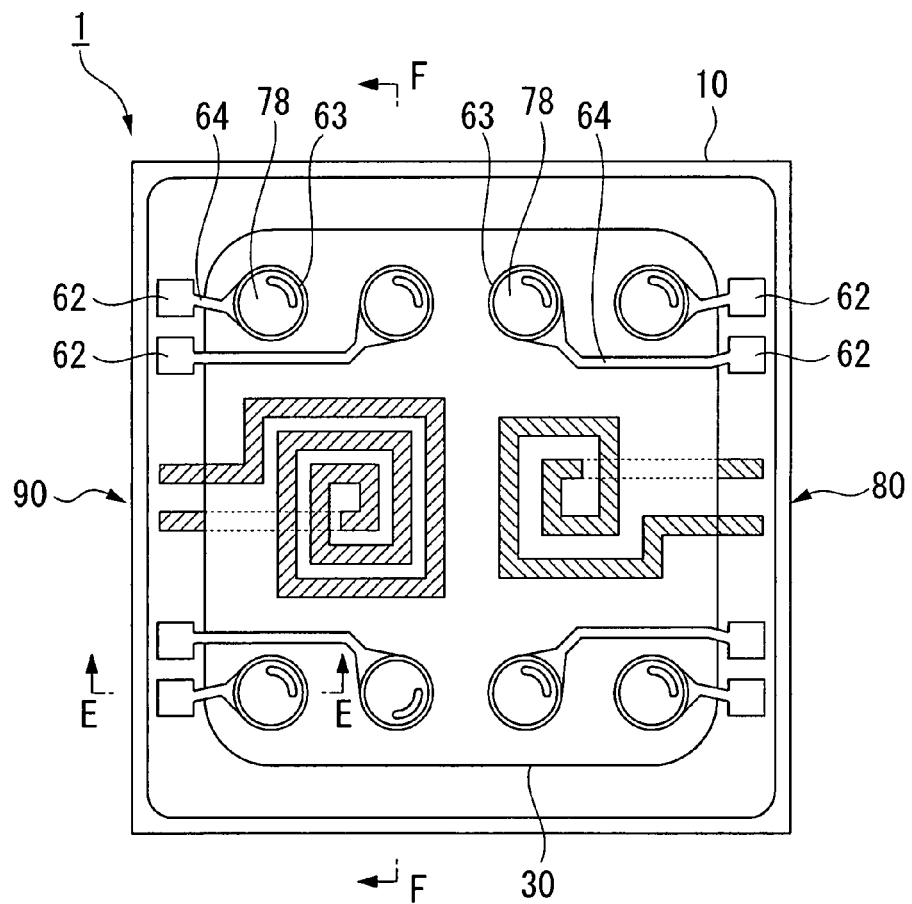
FIGS. 5A and 5B are explanatory views of the electronic substrate related to the second embodiment.
Figure 5B:
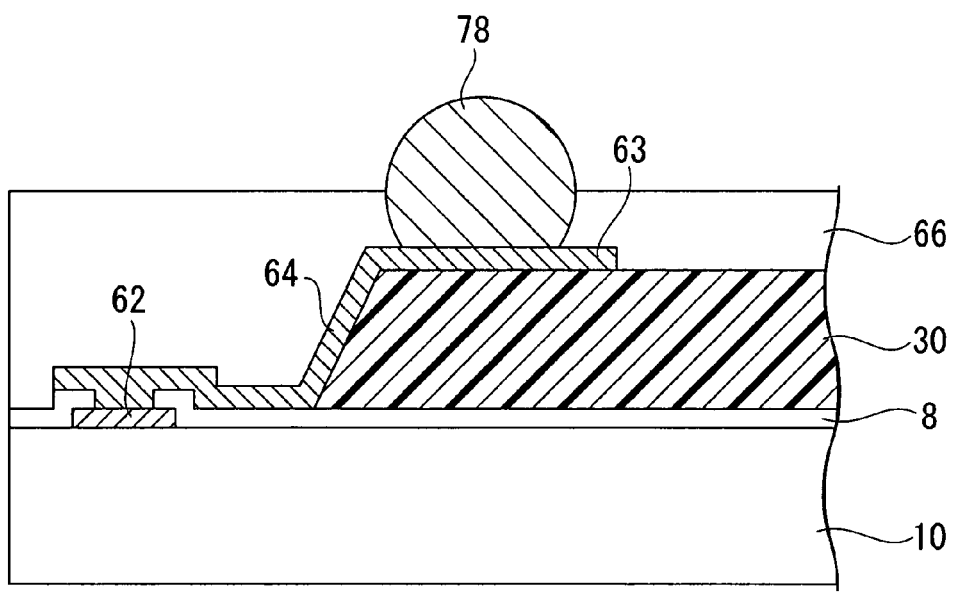

FIGS. 5A and 5B are explanatory drawings of electronic substrate related to the second embodiment. FIG. 5A shows a plan view, while FIG. 5B shows the cross-sectional view taken along the line F-F in FIG. 5A.

As shown in FIG. 5A, electronic substrate 1 related to the second embodiment differs from the first embodiment that performs power transmission using inductor elements in that it performs power transmission using connection terminal 63.

Moreover, the electronic substrate related to the second embodiment differs from the first embodiment in that it performs communications using the inductor elements 80 and 90.

Note that detailed explanations of parts with the same configuration as the first embodiment are omitted here.

Relocated Wiring and So On

As shown in FIG. 5A, a plurality of electrodes 62 are aligned along the peripheral edge of electronic substrate 1 to receive external power supply.

Due to the miniaturization of electronic substrate 1 in recent years, the pitch of the adjacent electrodes 62 has become extremely small.

When this electronic substrate 1 is packaged on a member on the other side, there is concern that short-circuitting occur between the adjacent electrodes 62.

To increase the pitch of the electrodes 62, relocated wiring 64 of electrode 62 has been formed.

In the explanations below, a "member on the other side" refers to an object to be connected to the electronic substrate 1.

More specifically, connection terminal 63 including a plurality of pads, is formed at the center of the surface of the electronic substrate 1.

The relocated wiring 64 drawn out from electrode 62 is connected to this connection terminal 63.

As a result, the electrode 62 of small pitch is drawn out to the center and the pitch is increased.

Wafer Level Chip Scale Package (W-CSP) technology is used in the formation of such an electronic substrate 1. In this technology, batch relocated wiring and resin sealing are performed to separate each electronic substrate 1.

As shown in FIG. 5B, a bump 78 is formed on the surface of each connection terminal 63.

This bump 78 may be a solder bump, and is formed by a method such as the printing method.

This bump 78 is dissolved by reflow or other method, and connected to the connection terminal of the member on the other side.

Solder resist 66 is formed around the bump 78.

The solder resist 66 becomes a wall of the solder bump 78 when the electronic substrate 1 is packaged on the member on the other side, and is made of a material such as resin material with electric insulating properties.

The entire surface of the electronic substrate 1 is covered by the solder resist 66.

However, when the electronic substrate 1 is packaged on a member on the other side, because of the difference in the coefficient of thermal expansion between the base substrate 10 of the electronic substrate 1 and the member on the other side, thermal stress is generated between the two members.

A stress relaxation layer 30 is formed between the connection terminal 63 and the base substrate 10 for relaxation of this thermal stress.

The stress relaxation layer 30 is formed to a specific thickness using photosensitive polyimide, benzocyclobutene (BCB), or a resin material such as phenolic novolac resin.

As shown in FIG. 5A, the inductor elements 80, 90 are also formed on the electronic substrate 1 related to the second embodiment.

Flat inductor elements (spiral inductor element) similar to the first embodiment are used as the inductor elements 80 and 90.

The winding wire of each inductor element 80 and 90 is formed on the surface of the stress relaxation layer 30 mentioned above.

This stress relaxation layer 30 is made of a resin material that is dielectric, thus it functions similar to the dielectric layer in the first embodiment.

Accordingly, each inductor element 80 and 90 can be arranged separately from the base substrate 10 by the stress relaxation layer 30, and the electromagnetic wave output from each inductor element 80 and 90 can be inhibited from being absorbed by the base substrate 10.

The number of turns in the winding wire of the second inductor element 90 is more than that of the winding wire in the first inductor element 80.

Accordingly, the applicable frequency of the second inductor element 90 shifts more toward the low frequency area than that of the first inductor element 80 in the characteristic of the inductor.

However, the second inductor element 90 is not used for power transmission, but is used for communications together with the first inductor element 80.

For this reason, the applicable frequency of each inductor element 80 and 90 are adjusted in the range of 2 to 5 GHz.

The difference in the applicable frequency of the second inductor element 90 and the first inductor element 80 is small compared to the first embodiment.

Manufacturing Method for Electronic Substrate

Next, the manufacturing method for the electronic substrate related to the second embodiment is described here.

FIGS. 6A to 7B are process diagrams of the manufacturing method for electronic substrate related to the second embodiment. They are cross-sectional views taken along the line F-F in FIG. 5A.

The W-CSP technology is used in the production of electronic substrate.

That is, all the processes below for wafers are batch processed, and finally, each electronic substrate is separated.

Figure 6A:
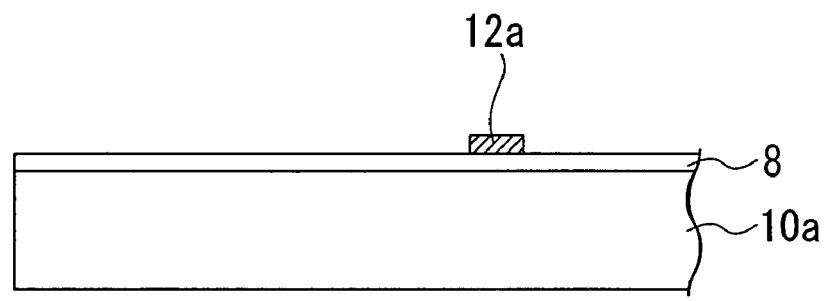
FIGS. 6A to 6C are process diagrams of the manufacturing method for the electronic substrate related to the second embodiment.

First, as shown in FIG. 6A, a connecting wire 12a is formed on the surface of the passivation film 8 of wafer 10a.

Its pre-requisite is that a base film (not shown in the views) be formed over the entire surface of the passivation film 8.

This base film includes a lower barrier layer and an upper seed layer.

The barrier layer prevents diffusion of Cu constituting the connecting wire 12a, and is formed to a thickness of about 100 nm by compounds such as TiW or TiN.

The seed layer functions as an electrode when the connecting wire 12a is formed by the electro-plating method, and is formed continuously to a thickness of 100 nm by Cu or the like.

These layers are generally formed by methods such as the sputtering method, the CVD method, and the electroless plating method.

Next, a mask with opening is formed in the formation area of the connecting wire 12a.

Next, electrolytic copper plating is performed taking the seed layer of the base film as the electrode, Cu is embedded in the opening of the mask, and the connecting wire 12a is formed.

This wire may also be formed by a method such as the electroless plating method.

After mask removal, the base film is etched with the connecting wire 12a as the mask.

Figure 6B:
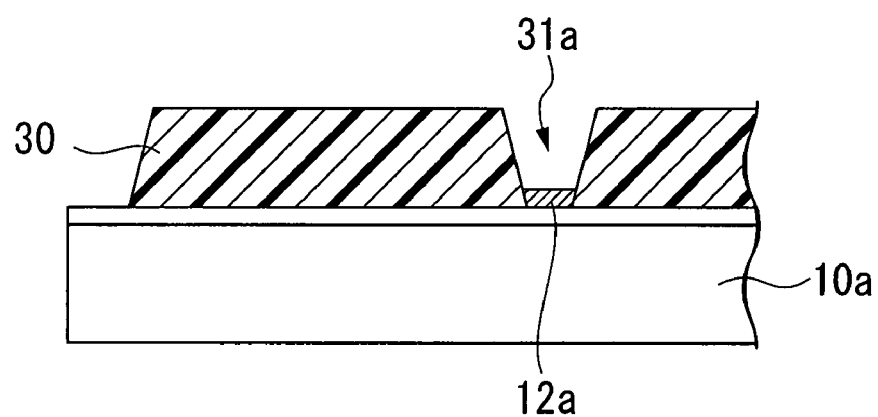

Next, as shown in FIG. 6B, the stress relaxation layer 30 is formed on the surface of the wafer 10a.

A through hole 31a of the stress relaxation layer 30 is formed such that one end of the connecting wire 12a is exposed.

The stress relaxation layer 30 can be formed by using a method such as the printing method or photolithography.

Especially, if a photosensitive resin material is used as a component of the stress relaxation layer 30, the stress relaxation layer 30 can be patterned easily and accurately using photolithography.

Figure 6C:
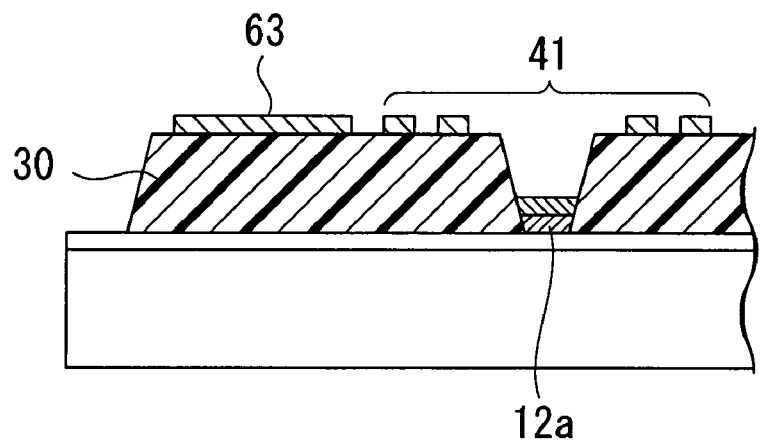

Next, as shown in FIG. 6C, the relocated wiring and the connection terminal 63 (hereafter referred to as "connection terminal 63 or the like") are formed on the surface of the stress relaxation layer 30.

During the formation process of the connection terminal 63 or the like, winding wire 41 is formed on the surface of the stress relaxation layer 30 simultaneously with the formation of the connection terminal 63 or the like.

More specifically, this method is similar to the method of formation of the connecting wire 12a mentioned above.

In this way, by forming the winding wire 41 simultaneously with the connection terminal 63 or the like, the production process can be simplified and the production cost can be reduced.

Also, the winding wire 41 can be accurately formed using a method such as plating or photolithography, and inductor element with the desired characteristics can be formed.

By trimming the winding wire 41 formed on the surface of the stress relaxation layer 30 by laser or other means, the characteristics of inductor element can be tuned.

Figure 7A:
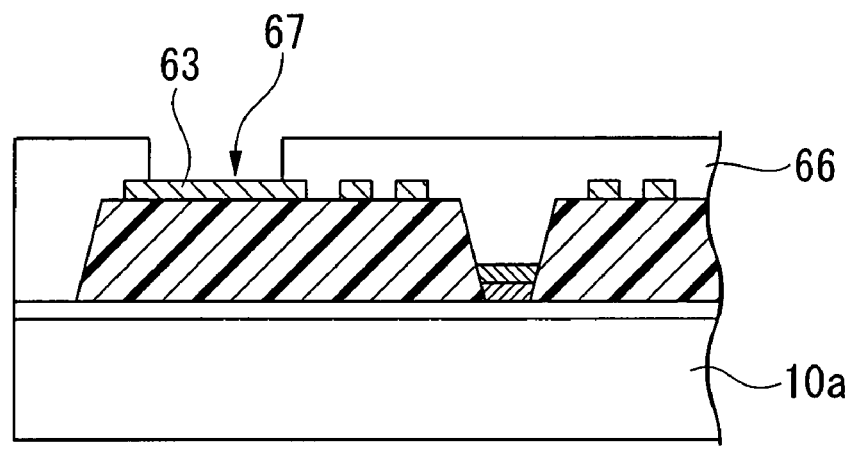
FIGS. 7A and 7B are process diagrams of the manufacturing method for the electronic substrate related to the second embodiment.

Next, solder resist 66 is formed on the entire surface of the wafer 10a, as shown in FIG. 7A.

Opening 67 of the solder resist 66 is formed above the connection terminal 63.

Figure 7B:
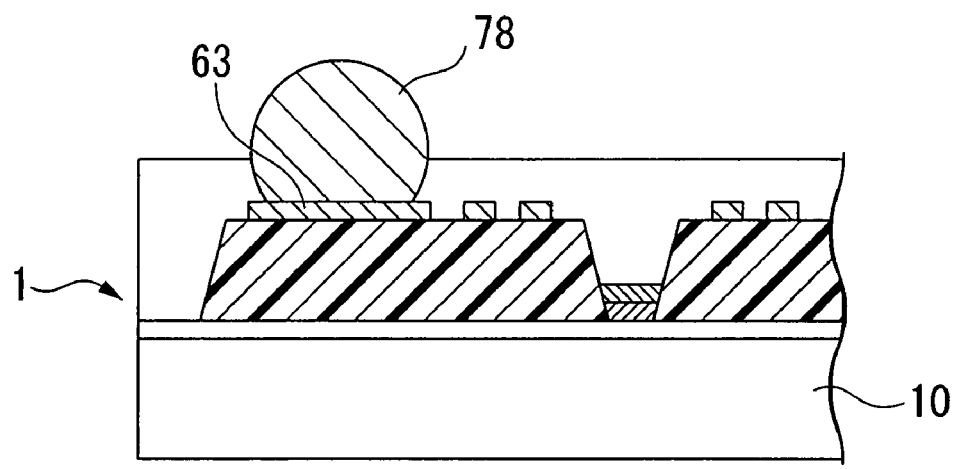

Next, bump 78 is formed on the surface of the connection terminal 63 on the inside of this opening, as shown in FIG. 7B.

Subsequently, each base substrate 10 is separated from the wafer.

The separation of the base substrate 10 can be done by a method such as dicing.

The above step completes the electronic substrate 1 related to this embodiment.

Semiconductor Device

Figure 8:
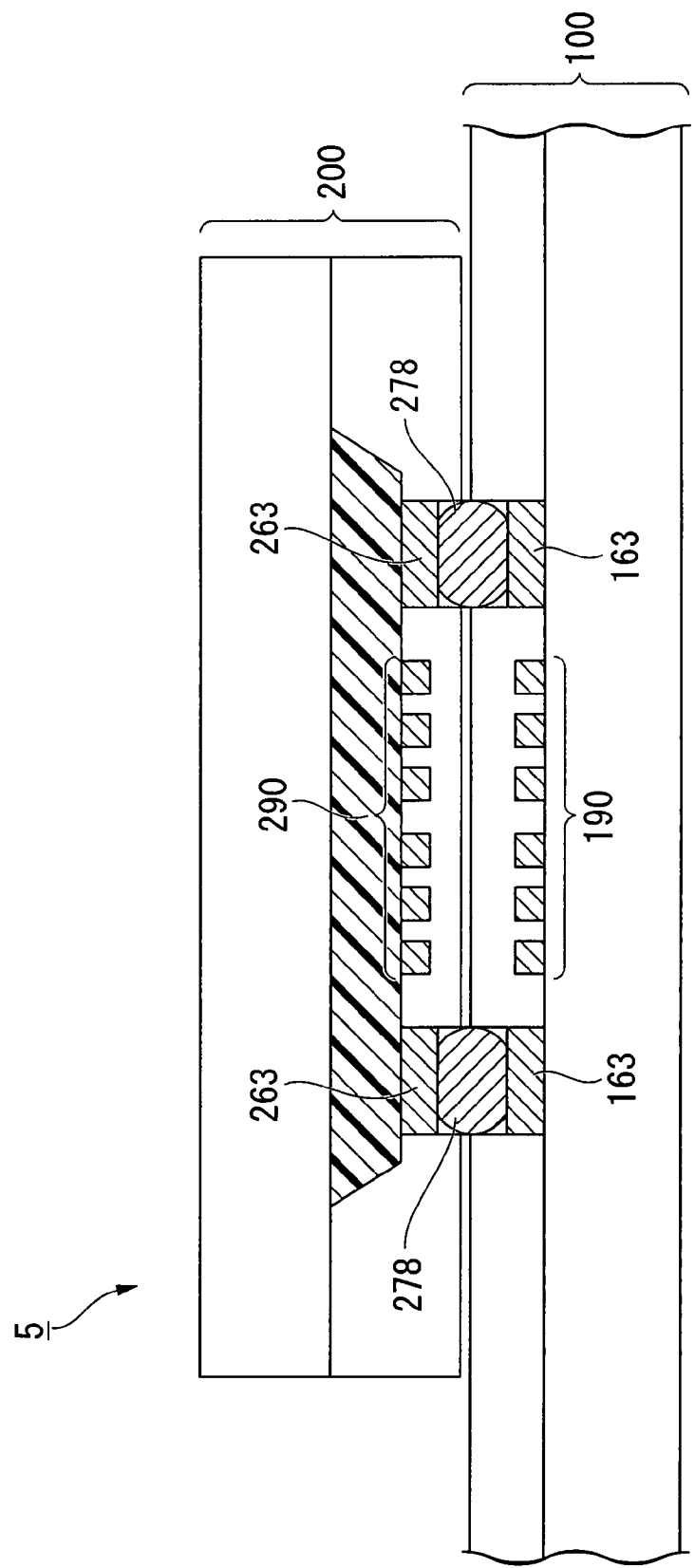
FIG. 8 is an explanatory view of the semiconductor device related to the second embodiment.

FIG. 8 is an explanatory drawing of a semiconductor device related to the second embodiment, and is the cross-sectional view taken along the line F-F in FIG. 5A.

As shown in FIG. 8, semiconductor device 5 related to the second embodiment includes a motherboard 100. A first electronic substrate 200 is packaged on the surface of the motherboard 100.

The connection terminal 163 connecting the first electronic substrate 200 is formed on the surface of the motherboard 100.

Also, the first inductor element (not shown in the views) and the second inductor element 190 are formed on the surface of the motherboard 100.

Each inductor element is used for communications. The applicable frequency is adjusted in the range of 2 to 5 GHz.

The first electronic substrate 200 is packaged on the surface of the motherboard 100.

More specifically, the connection terminal 163 formed on the first electronic substrate 200 is disposed such that it faces the connection terminal 263 of the motherboard 100.

The solder bump 278 formed on the surface of the connection terminal 163 of the first electronic substrate 200 is connected to the connection terminal 263 of the motherboard 100 by reflow or other methods.

Also, the first inductor element of the first electronic substrate 200 and the first inductor element of the motherboard 100 are formed at the equivalent applicable frequency, and are disposed to face each other.

Also, the second inductor element 290 of the first electronic substrate 200 and the second inductor element 190 of the motherboard 100 are formed at the equivalent applicable frequency, and are disposed to face each other.

The semiconductor device 5 configured as mentioned above, transmits power from the motherboard 100 to the first electronic substrate 200 via the connection terminals 163 and 263.

In this way, power transmission can be performed correctly and in a stable manner through connection terminals.

This also improves the operational reliability of the semiconductor device 5.

Also, the first inductor element of the motherboard 100 and the first inductor element of the first electronic substrate 200 are used as antenna in the semiconductor device 5. Electromagnetic waves are sent/received by this antenna.

Also, the second inductor element 190 of the motherboard 100 and the second inductor element 290 of the first electronic substrate 200 are made to function as antenna. Electromagnetic waves are sent/received by this antenna.

In this structure, communications is carried out between the motherboard 100 and the first electronic substrate 200.

In this case, since the applicable frequency of the pair of first inductor elements and the pair of second inductor elements is different, interference can be prevented.

For instance, the electromagnetic wave transmitted by the first inductor element of the motherboard 100 is received only by the first inductor element having the same applicable frequency in the first electronic substrate 200, and is not received by the second inductor element 290 having a different applicable frequency.

In this way, by preventing interference, multi-bit serial communications can be performed, and communication speed can be improved.

It is needless that the motherboard 100 and the first electronic substrate 200 are aligned with high precision, so that the production cost can be reduced.

Electronic Device

Next, an example of electronic device including the electronic substrate mentioned above, is described here.

Figure 9:
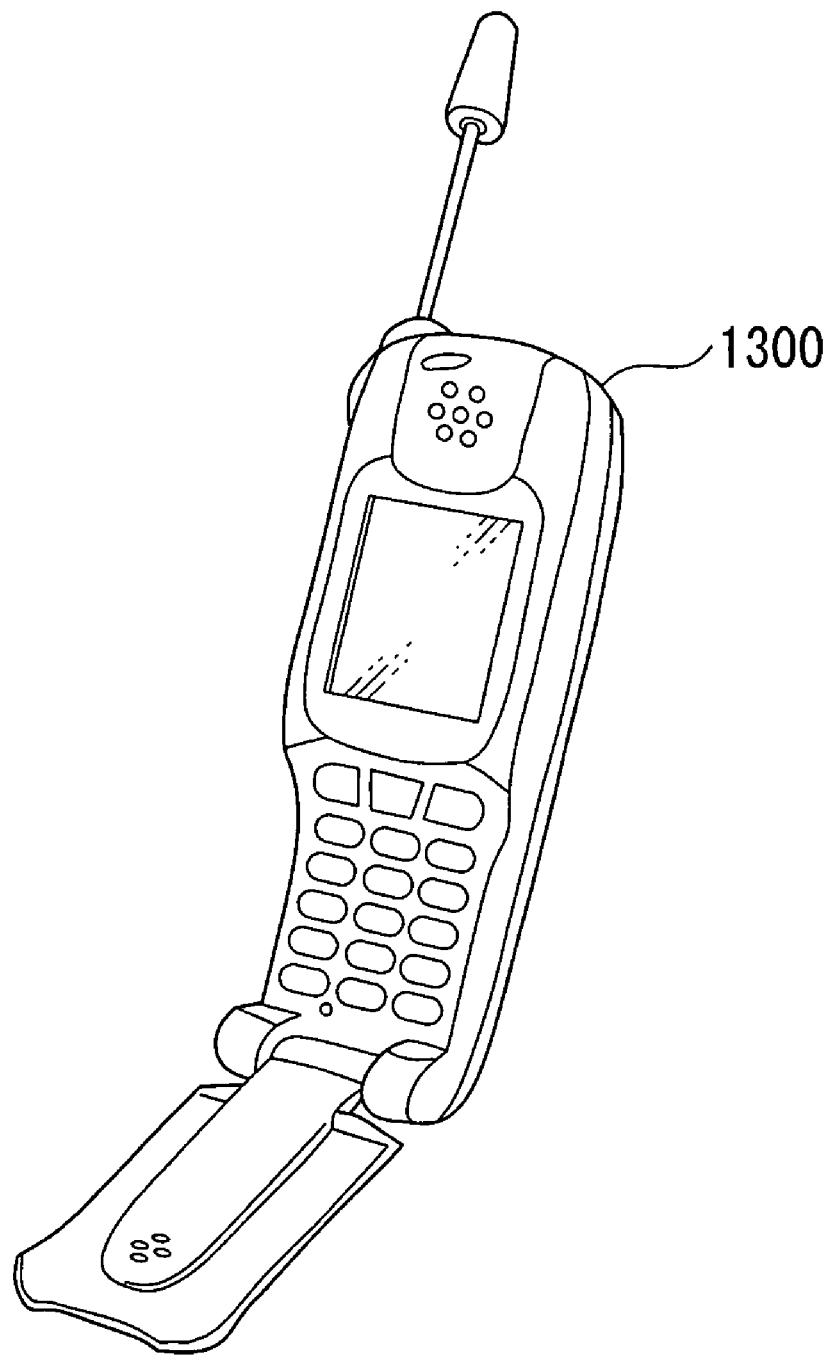
FIG. 9 shows a perspective view of a mobile telephone.

FIG. 9 shows a perspective view of a mobile telephone.

The electronic substrate mentioned above is disposed within the body of mobile telephone 1300.

The construction according to this configuration is simple and electronic substrate with excellent workability for packaging is provided, thus a mobile telephone can be provided at low cost.

The electronic substrate mentioned above can be used in various kinds of electronic devices in addition to the mobile telephone.

For instance, it can be used in electronic devices such as liquid crystal projector, multimedia personal computer (PC) and engineering workstation (EWS) pager, word processor, television, viewfinder-type or direct-viewing type video tape recorder, electronic organizer, desktop electronic calculator, car navigation system, POS terminal, and other devices equipped with touch panel.

In all cases, low-cost electronic devices can be offered.

Note that the scope of the skill of this invention is not limited to the embodiment mentioned above, and various changes may be effected to this embodiment without departing from the spirit and scope of this invention.

That is, the materials or layer configuration given in detail in the embodiment are merely examples, and these can be changed appropriately.

For instance, the inductor elements were formed on or above the active face of the base substrate in the embodiment mentioned above, but even the inductor elements may be formed on or above the rear face of the base substrate.

In this case, inductor elements formed on or above the rear face are electrically connected to the active face after forming through electrodes on the base substrate.

Also, two inductor elements were formed on or above the active face of the base substrate in the embodiment mentioned above, but even three inductor elements may be formed on or above the active face of the base substrate.

Moreover, in the embodiment mentioned above, all inductor elements were made to function as antenna, but a part of the inductor elements may be made to function as passive elements and oscillator circuits may be formed.

Also, in the embodiment above, inductor element was formed on the base substrate on which electronic circuit was formed, but inductor element may even be formed on base substrate made of an electrically-insulated material.

In the embodiment above, winding wire was formed by the electro-plating method, but other film formation methods such as sputtering method or vapor deposition method may be used.

Patterns of injector or antenna may be directly formed using a method such as an ejection method without going through the film formation process.

Among all the embodiments described above, only examples of formation of inductor or antenna on electronic substrate were described. However, this invention is not limited to only these examples, and parts other than inductor formed by the thin film or thick film process, such as for instance, compound electronic parts including capacitors and resistors may be formed on the electronic substrate.

Moreover, these parts may be formed as compound electronic parts on electronic substrate using a different method, such as by surface packaging technology.

What is claimed is:

1. An electronic substrate comprising:
a base substrate having an active face and a rear face;
a passivation film formed on the active face of the base substrate;

a plurality of inductor elements formed on or above the active face, or formed on or above the rear face, and having a winding wire, the winding wire having an inner end and an outer end;
a first electrode and a second electrode formed in an array at a peripheral portion of the active face of the base substrate;
a first connecting wire formed on the passivation film and connected to the first electrode;
a dielectric layer formed between at least some of the inductor elements and the base substrate so as to cover the first connecting wire, including a through hole in which the inner end of the winding wire is connected to the first connecting wire; and
a second connecting wire connected to the outer end of the winding wire, connected to the second electrode, and formed on the dielectric layer.

2. The electronic substrate according to claim 1, wherein the inductor elements include:
a first inductor element; and
a second inductor element having an inductance value or an applicable frequency that are different from that of the first inductor element.

3. The electronic substrate according to claim 2, wherein the first inductor element is used for external power transmission, and the second inductor element is used for external communications.

4. The electronic substrate according to claim 2, further comprising:
a connection terminal formed on the base substrate, used for external power transmission, wherein
the first inductor element and the second inductor element are used for external communications.

5. The electronic substrate according to claim 1, wherein:
the dielectric layer is made of material having a dielectric dissipation factor smaller than that of the base substrate.

6. The electronic substrate according to claim 1, wherein the inductor elements include:

a first inductor element; and
a second inductor element, wherein the number of turns in the winding wire of the second inductor element is more than that of the winding wire in the first inductor element.

7. A semiconductor device, comprising:
a plurality of electronic substrates, each of which includes:
a base substrate having an active face and a rear face;
a passivation film formed on the active face of the base substrate:
a plurality of inductor elements formed on or above the active face, or on or above the rear face, and having a winding wire, the winding wire having an inner end and an outer end;
a first electrode and a second electrode formed in an array at a peripheral portion of the active face of the base substrate;
a first connecting wire formed on the passivation film and connected to the first electrode;
a dielectric layer formed between at least some of the inductor element and the base substrate so as to cover the first connecting wire, including a through hole in which the inner end of the winding wire is connected to the first connecting wire; and
a second connecting wire connected to the outer end of the winding wire, connected to the second electrode, and formed on the dielectric layer,
wherein the electronic substrates are disposed so as to be laminated, the inductor element functions as an antenna sending or receiving electromagnetic waves so as to send or receive signals between the electronic substrates.

8. The semiconductor device according to claim 7, wherein the inductor elements formed on a pair of the electronic substrates sending or receiving signals are disposed to face each other.

* * * * *